(12) United States Patent
Li et al.

(10) Patent No.: US 7,291,727 B1
(45) Date of Patent: Nov. 6, 2007

(54) LIGHT-HARVESTING DISCOTIC LIQUID CRYSTALLINE PORPHYRINS AND METAL COMPLEXES

(75) Inventors: Quan Li, Stow, OH (US); Xiaoli Zhou, Kent, OH (US)

(73) Assignee: Kent State University, Kent, OH (US)

( * ) Notice: Subject to any disclaimer, the term of this patent is extended or adjusted under 35 U.S.C. 154(b) by 0 days.

(21) Appl. No.: 11/638,163

(22) Filed: Dec. 13, 2006

Related U.S. Application Data

(63) Continuation of application No. 11/325,478, filed on Jan. 4, 2006.

(60) Provisional application No. 60/790,996, filed on Apr. 11, 2006.

(51) Int. Cl.
*C07D 487/22* (2006.01)
*C07D 225/04* (2006.01)
*H01L 51/44* (2006.01)
*H01L 31/042* (2006.01)
*H01L 35/24* (2006.01)
*C09K 19/34* (2006.01)
*C09K 19/32* (2006.01)

(52) U.S. Cl. .................. 540/145; 540/465; 257/40; 136/263; 438/30; 438/99; 252/299.61; 252/299.62

(58) Field of Classification Search ........... 252/299.01, 252/299.61, 299.62; 540/145, 465; 136/263; 257/40; 438/30, 99
See application file for complete search history.

(56) References Cited

U.S. PATENT DOCUMENTS

| | | | | |
|---|---|---|---|---|
| 5,683,833 | A * | 11/1997 | Haussling et al. | 429/306 |
| 2003/0034722 | A1* | 2/2003 | Tsuboyama et al. | 313/311 |
| 2003/0188777 | A1* | 10/2003 | Gaudiana et al. | 136/263 |
| 2003/0192584 | A1* | 10/2003 | Beckenbaugh et al. | 136/256 |
| 2003/0226996 | A1* | 12/2003 | Aramaki et al. | 252/62.3 Q |

FOREIGN PATENT DOCUMENTS

| | | |
|---|---|---|
| GB | 1458117 | 12/1976 |
| JP | 2004-120080 | 4/1992 |
| JP | 2002-129051 | 5/2002 |
| JP | 2002-343572 | 11/2002 |
| WO | WO 9720846 | 6/1997 |

OTHER PUBLICATIONS

CAPLUS 2000: 527744.*
Akopova et al, "The Prognostication of Columnar Mesophases-Synthesis and Mesomorphism of Some Porphyrin Derivatives", Molecules, 2000, vol. 5, pp. 797-808.*

(Continued)

*Primary Examiner*—Shean C Wu
(74) *Attorney, Agent, or Firm*—Fay Sharpe LLP

(57) ABSTRACT

Novel discotic liquid crystalline porphyrins and discotic liquid crystalline metal complexes, methods for their preparation, and device fabrication are disclosed. Materials with partially perfluorinated alkyl group in the peripheral chains show a strong tendency towards the formation of homeotropic alignment. These compounds are capable of being used as high-efficiency photovoltaic materials, organic semi-conducting materials, and organic light emitting materials.

26 Claims, 12 Drawing Sheets

OTHER PUBLICATIONS

Forrest, Stephen R., "The Limits to Organic Photovoltaic Cell Efficiency", *MRS Bulletin*, vol. 30, Jan. 2005, pp. 28-32.

Grätzel, Michael, "Dye-Sensitized Solid-State Heterojunction Solar Cells", *MRS Bulletin*, vol. 30, Jan. 2005, pp. 23-27.

Gregg, Brian A., Fox, Marye Anne and Brad, Allen J., "2,3,7,8,12,13,17,18-Octakis(β-hydroxyethyl) porphyrin (Octaethanoloporphyrin) and Its Liquid Crystalline Derivatives: Synthesis and Characterization", *Journal American Chemical Society*, (1989) vol. III, pp. 3024-3029.

Hatsuska, K., Ohta, K., Yamamoto, I. and Shirai, H., "Discotic liquid crystals of transition metal complexes, Part 30: spontaneous uniform homeotropic alignment of octakis(dialkoxyphenoxy) phthalocyaninatocopper (ii) complexes", *Journal of Materials Chemistry*, (2001), vol. II, pp. 423-433, © The Royal Society of Chemistry 2000.

Janssen, R. A.J., Hummelen, J.C. and Sariciftci, N.S., "Polymer-Fullerene Bulk Heterojunction Solar Cells", *MRS Bulletin*, vol. 30, Jan. 2005, pp. 33-36.

Kippelen B., et al., "Organic Photovoltaics Based on Self-Assembled Mesophases", ncpb and Solar Program Review Meeting 2003, NREL/CD-520-33586, pp. 431-434.

Kumar, S., "Discotic liquid crystals for solar cells", *Current Science*, vol. 82, No. 3, Feb. 10, 2002, pp. 256-257.

Patel, B. R. and Suslick, K.S., "Discotic Liquid Crystals from a Bis-Pocketed Porphyrin", *Journal American Chemical Society*, 1998, vol. 120, pp. 11802-11803.

Schouten, P. G., et al., "Charge migration in supramolecular stacks of peripherally substituted porphyrins", *Nature*, vol. 353, Oct. 24, 1991 pp. 736-737.

van de Craats, A. M., Warman, J. M., Hasebe, H., Natio, R. and Ohta, K., "Charge Transport in the Mesomorphic Free-Radical Compound Bis(octakis(dodecyloxy)phthalocyaninato)lutetium(III)", *Journal Phys. Chem. B* (1997), 101, pp. 9224-9232, © 1997 American Chemical Society.

Yang, F., Shtein, M. and Forrest, S. R., "Controlled growth of a molecular bulk heterojunction photoactive cell", *Nature Materials*, vol. 4, Jan. 2005, pp. 37-41.

Castella, M. et al., "First asymmetrically β-tetrasubstituted porphyrin-based discotic lamellar liquid crystal", *Liquid Crystals*, vol. 29, No. 4, pp. 559-565 (2002), Taylor & Francis Ltd. Abington GB, XP-001082971, ISSN 0267-8292.

Li, Jianzhong et al., "Synthesis and mesomorphic behavior of novel discotic *meso*-tetra (3,4,5-n-trialkoxybenzoylaminophenyl)porphyrins", *Liquid Crystals*, vol. 30, No. 8, pp. 913-919, (Aug. 2006) Taylor & Francis Ltd. Abington GB, XP-001246011, ISSN 0267-8292.

Liu, Wei et al., "Synthesis and characterization of liquid crystalline 5, 10, 15, 20-tetrakis(4-n-alkanoyloxphenyl)porphyrins", *Liquid Crystals*, vol. 30, No. 11, pp. 1255-1257 (Nov. 2003) Taylor & Francis Ltd. Abington GB, XP-001174710, ISSN 0267-8292.

Maeda, Y. et., "Preliminary communication. Enantiotropic and monotropic transitions of the discotic mesogen 5, 10,15,20-tetrakis(4-n-dodecylpheny)porphyrin under pressure", *Liquid Crystals*, vol. 25, No. 4, pp. 537-542 (1998) Taylor & Francis Ltd. Abington GB, XP-000775466, ISSN 0267-8292.

Ohta, K. et al., "Discotic liquid crystals of transition metal complexes. Part 24 Synthesis and mesomorphism of porphyrin derivatives substituted with two or four bulky groups", *Journal of Materials Chemistry*, vol. 8, No. 12 pp. 2637-2650 (Dec. 1998) The Royal Society of Chemistry, Cambridge, GB, XP-000804818, ISSN 959-9428.

Ramasseul, R. et al., "Preliminary Communication. Phase transitions of long chain esters of meso-tetrakis(para-carboxyphenyl)porphyrin", *Liquid Crystals*, vol. 13, No. 5, pp. 729-733, (1993) Taylor & Francis Ltd, Abington GB, XP-000383131, ISSN 0267-8292.

Shimizu, Y. et al., "Mesomorphic phase transitions of tetraphenyloporphrins with four long aliphatic chains", *Liquid Crystals*, vol. 14, No. 3, pp. 795-805, (1993) Taylor & Francis Ltd. Abington GB, XP-000383132, ISSN 0267-8292.

Yu, M. et al., "Synthesis and properties of 5,10,15,20-tetral[(4-alkoxy-3-ethyloxy)phenyl]porphyrin hydroxylanthanide liquid crystal complexes", *Liquid Crystals*, vol. 32, No. 6, pp. 771-780 (Jun. 2005) Taylor & Francis Ltd. Abington GB, XP-001232614, ISSN 0267-8292.

* cited by examiner

22a

22b

LIGHT-HARVESTING DISCOTIC LIQUID CRYSTALLINE PORPHYRINS AND METAL COMPLEXES

The present application claims priority to U.S. Provisional Patent Application Ser. No. 60/790,996, filed Apr. 11, 2006, and is a continuation in part and claims priority from prior U.S. patent application Ser. No. 11/325,478, filed Jan. 4, 2006.

BACKGROUND

The present exemplary embodiments relate to discotic liquid crystalline porphyrins and discotic liquid crystalline porphyrin metal complexes. In certain embodiments, their homeotropically or homogenously aligned architecture, in which the columns formed by intermolecular stack are spontaneously perpendicular or parallel on the surface respectively, is a crucial point for their applications. They find use as high-efficiency photovoltaic materials, organic semiconducting materials, organic light emitting materials, materials for organic transistors and in solar cell device implementation. However, it is to be appreciated that the present exemplary embodiments are also amenable to other like applications.

In the long term, solar energy is the only source of renewable energy that has the capacity to fill humanity's technological needs. A grand challenge is to convert solar energy into green electric energy in an inexpensive and efficient way. Crystalline silicon photovoltaic cells, though efficient, are too expensive to compete with primary fossil energy. Organic photovoltaic (OPV) technology would hold the promise for cost reduction since the OPV materials are potentially cheap, easy to process, and capable of being deposited on flexible substrates such as plastics and bending, where their inorganic competitors e.g. crystalline silicon would crack.

New OPV materials able to efficiently absorb sunlight and new approaches based on nanostructured architectures holds the potential to revolutionize the technology used to produce solar electricity; however the availability of such new materials with tailored properties has undoubtedly posed a bottleneck to the OPV technology. A breakthrough of new material development is urgently needed to boost the feasibility and prevalence of OPV technology. Currently widely used OPV materials, e.g. polycrystalline Cu phthalocyanine, suffer from the scattering of electron/exciton between small crystal grain boundaries in which random arrangement of molecules results in poor charge mobility. The existing grain boundaries and defects act as deep traps that dramatically reduce the charge mobility. In addition, polycrystalline materials are intrinsically inhomogeneous. The attainment of large defect-free single crystals or single crystalline film of large area of either inorganic (e.g. silicon) or organic molecules is difficult and costly.

A challenge for OPV, with the possibility of very significant cost reduction, is to make them in desired macroscopic order to improve charge transportation etc. Discotic liquid crystals (LCs) capable of being homeotropically aligned (i.e. the columns formed by intermolecular strong stack are perpendicular to the electrode surface) would be a desirable candidate to meet the challenge since they can form ordered nanostructures at macroscopic scale for photovoltaic application. Unfortunately, the preferable homeotropic-alignment of discotic LCs, especially those having large conjugated systems, is difficult to achieve due to their high viscosity and poor affinity to substrates, as compared to the well established technologies for their calamitic counterparts in the display industry.

In order to make discotic LC with more efficient absorption of sunlight, one should consider porphyrin as the building block of the potentially most viable discotic material since it is the basic structure of the best photoreceptor in nature, chlorophyll. Porphyrin and its derivatives have many desirable features such as highly conjugated plane, high stability, intense absorption of sunlight, and the small gap between the highest occupied molecular orbital (HOMO) and lowest unoccupied molecular orbital (LUMO) energy level.

As will be described in detail, the present disclosure is an important extension of our previous application above. The materials described herein provide a broad range of discotic LCs capable of forming homeotropically/homogeneous aligned architecture. Chemical modifications can provide a way to control and improve their alignment which is a crucial point for their applications. The materials are capable of being used as photovoltaic materials, organic semiconductors and organic light emitting materials. Although the drawings, discussions and descriptions are mainly directed toward the preparation of the said materials, photovoltaic devices and methods, it is to be understood that the principles of the present invention are applicable to any type of devices that uses homeotropically or homogenously aligned architecture of any a discotic liquid crystal or the blend composed of a discotic liquid crystal and one or more other components as a layer.

BRIEF DESCRIPTION

In accordance with one aspect of the present exemplary embodiments, there is provided a discotic liquid crystalline porphyrin or complex, having the structure set forth in the claims.

In a second aspect, there is provided, a method for producing the porphyrin.

In a third aspect, there is provided a photovoltaic cell including the porphyrin.

In a fourth aspect, there is provided either bulk heterojunction cells with homeotropically aligned architecture of blends composed of a discotic liquid crystal and one or more other components which may be a material such as $C_{60}$, its derivative, dye and carbon nanotube, or double- or multilayered cells in which a donor layer includes a homeotropically aligned discotic liquid crystal or its homeotropically aligned blend together with an acceptor layer which may composed of a material such as $C_{60}$, its derivative, dye and carbon nanotube.

DETAILED DESCRIPTION

There is disclosed herein design and synthesis of novel liquid crystalline porphyrins that can be aligned to form an ordered architecture. These aligned architectures can facilitate charge transport in the direction along the columns, can be processed to form a large area single crystalline thin film, can respond to external light irradiation by changing their resistivity, and can convert light to electric energy etc.

Light-harvesting discotic liquid crystalline porphyrins and discotic crystalline porphyrin metal complexes, method for preparation, and device fabrication are disclosed. The discotic liquid crystalline porphyrins and metal complexes can be aligned into an ordered architecture, in which the columns formed by intermolecular stack are spontaneously perpendicular on the surface, i.e. homeotropic alignment. The aligned architecture, which is stable within a wide temperature range, can greatly enhance the charge carrier mobility, and thus can dramatically improve the light induced electric generation. Also, the discotic liquid crystalline porphyrins and metal complexes can be aligned into another ordered architecture, in which the columns formed by intermolecular stack are spontaneously parallel on the surface, i.e. homogenous alignment.

These compounds are capable of being used as high-efficiency photovoltaic materials, organic semiconducting materials, and organic light emitting materials. Materials with partially perfluorinated alkyl group in the peripheral chains show a particularly strong tendency towards the formation of homeotropic alignment. Applications of such materials may be made in electricity generation, photovoltaic devices, light emitting devices, photosensors, transistors, memory arrays and the like.

These materials may be mixed with other electron-acceptor materials such as, e.g., $C_{60}$ or its derivatives, dyes, and/or nanotubes. The blend, which can retain a homeotropically aligned architecture, can be used for achieving a high conversion efficiency of its heterojunction blend cell.

These materials and their blends may present advantages, including large area single crystal domain and high charge carrier mobility in the directions along columns.

The structures of the materials are porphyrin based molecules with 4 side chain groups of 3,4,5-alkylphenyl connected to a tetraphenylporphyrin core by linkage groups. The straight or branched alkyl chains R may include perfluoroalkyl, $C_{60}$ (fullerene), an aromatic moiety, one or more O, S, CO, COO, OOC, —N=N— and/or —C≡C— linkages. In one embodiment, the general structure is shown in FIG. 1.

Figure 1:
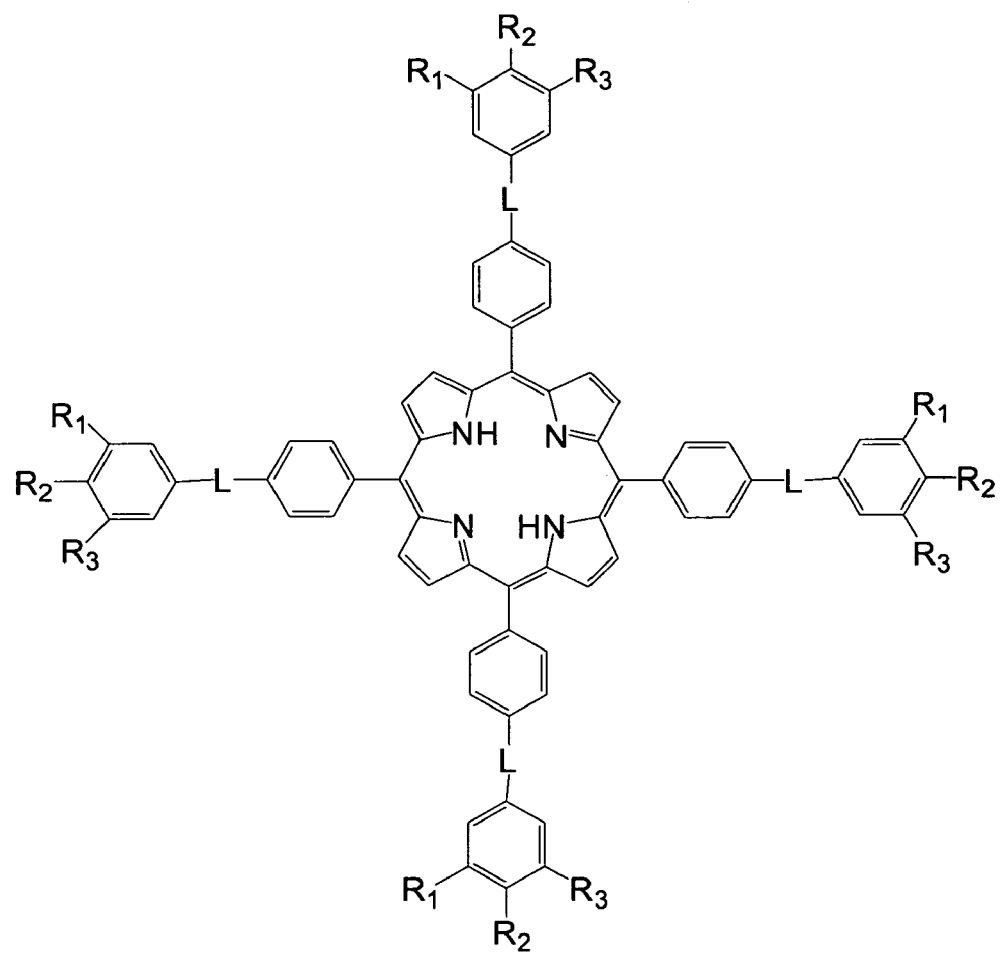
FIG. 1 is the molecular structure of one present embodiment compound.

In the disclosed structure of the exemplary light-harvesting discotic liquid crystalline porphyrins of FIG. 1, L is a linkage which may be COO, OOC, O, S, COS or NHCO; $R_1=R_2=R_3=C_{6-36}$ linear or branched alkoxy which may include perfluoroalkyl, $C_{60}$ (fullerene), an aromatic moiety, or one or more O, S, CO, COO, N=N and/or C=C. Alternately, $R_1=H$, $R_2=R_3=C_{6-36}$ linear or branched alkoxy which may include perfluoroalkyl group, $C_{60}$ (fullerene), aromatic moiety, or one or more O, S, CO, COO, N=N and/or C=C. In another embodiment, $R_2=H$, $R_1=R_3=C_{6-36}$ linear or branched alkoxy which may include perfluoroalkyl group, $C_{60}$ (fullerene), an aromatic moiety, or one or more O, S, CO, COO, N=N and/or C=C. In still another embodiment, $R_1=R_3=H$, $R_2=C_{6-36}$ linear or branched alkoxy which may include perfluoroalkyl, $C_{60}$ (fullerene), aromatic moiety, one or more O, S, CO, COO, N=N and/or C=C. In a preferred embodiment, the materials contain at least partially perfluorinated alkyl group in the peripheral chains, which show a strong tendency towards the formation of homeotropic alignment.

Figure 2:
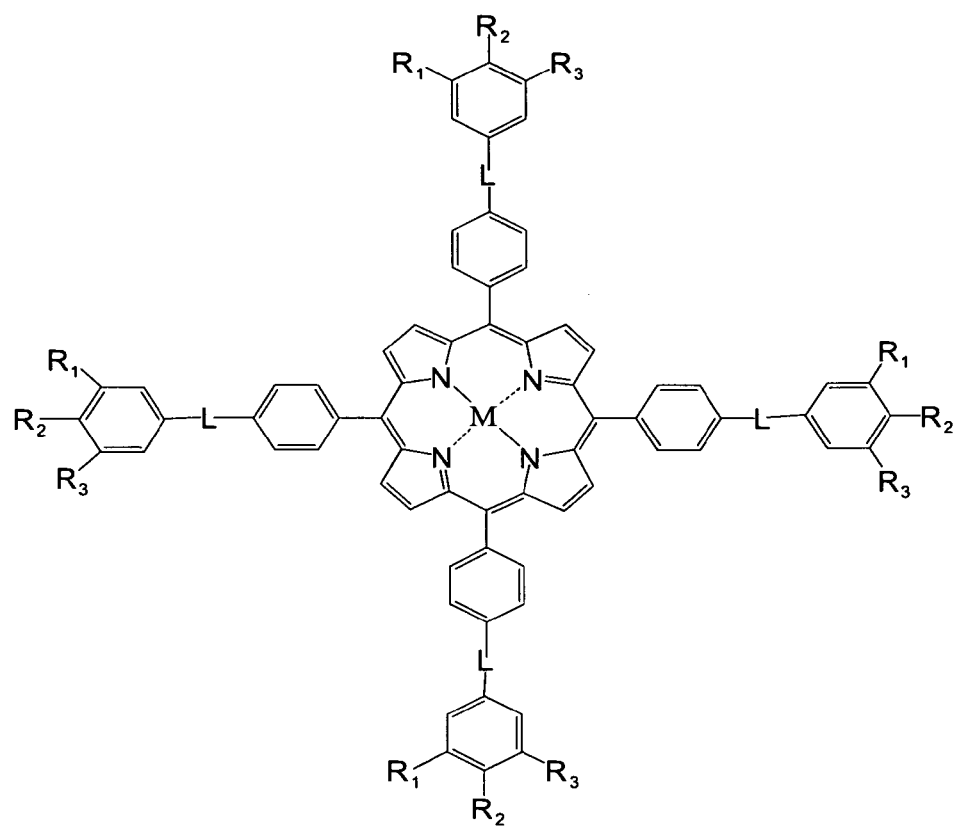
FIG. 2 is the molecular structure of another present embodiment compound.

In a second main embodiment, the inventive materials are discotic crystalline porphyrin metal complexes as shown in FIG. 2 wherein M=Zn, Co, Cu, Ni, Cr, Mn, Mg, Ce, Ru, Rh, Pt, Au, or lanthanide metals and may be bound to a halogen atom, O, —OH or =CO. As detailed above, these compounds are capable of being used as high-efficiency photovoltaic materials, organic semiconducting materials, and organic light emitting materials. In a preferred embodiment, the materials contain at least partially perfluorinated alkyl group in the peripheral chains, which show a strong tendency towards the formation of homeotropic alignment.

The general procedure for the preparation of one class of compounds according to one of the embodiments of this invention is provided below. In a first method, the target compounds are synthesized by 5,10,15,20-tetra(p-X-phenyl) porphyrin reacting with 3,4,5-tris-alkyl benzoic acid or benzoyl chloride in organic media. The intermediate tetra (p-X-phenyl)porphyrin is prepared by cyclocondensation of 4-X-benzaldehyde and pyrrole, wherein X and Y are reactive groups that react to form target molecule I as defined above (FIG. 1).

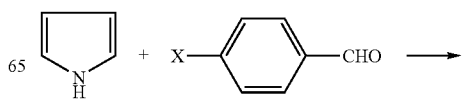

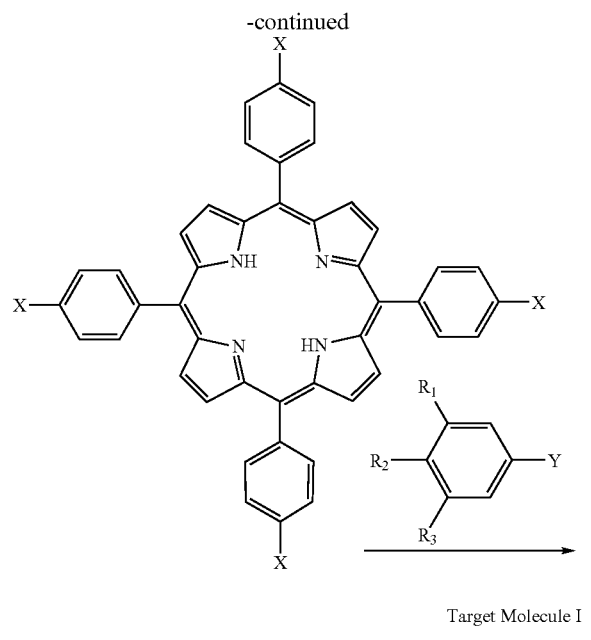

Target Molecule I

In a second method, the target compounds are synthesized by a cyclocondensation process in organic solvent or without solvent as shown more generally below:

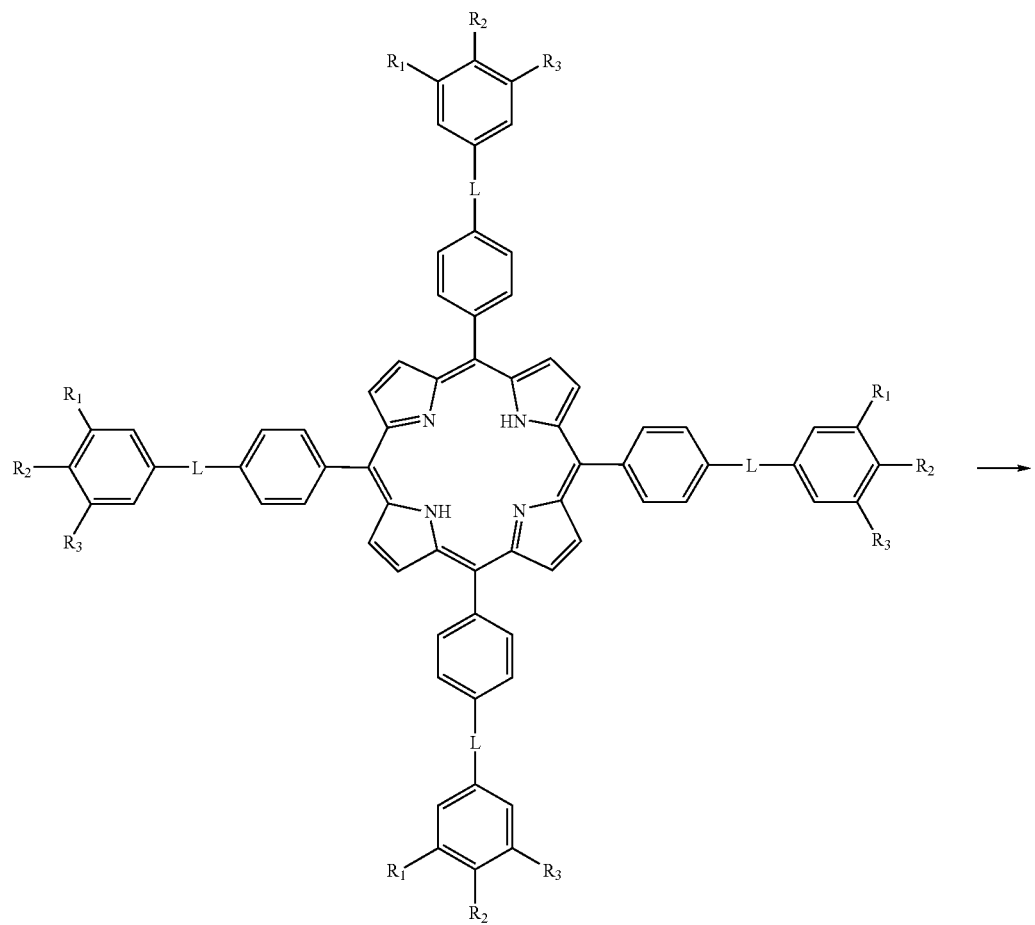

Target Molecule I

Suitable organic solvents include, e.g., propionic acid, propionic anhydride, pyrrole, methylene chloride, chloroform, N,N-dimethylformamide, N-methylpyrrolidone, pyridine, triethylamine, ether, tetrahydrofuran, alcohol, ethyl acetate, acetonitrile, ethyl methyl ketone, saturated aliphatic hydrocarbons and aromatic hydrocarbons.

A general procedure for the preparation of metal complexes as shown in FIG. 2 is provided below. Metal complexes are synthesized by metal-free porphyrin reacting with a metal salt.

-continued

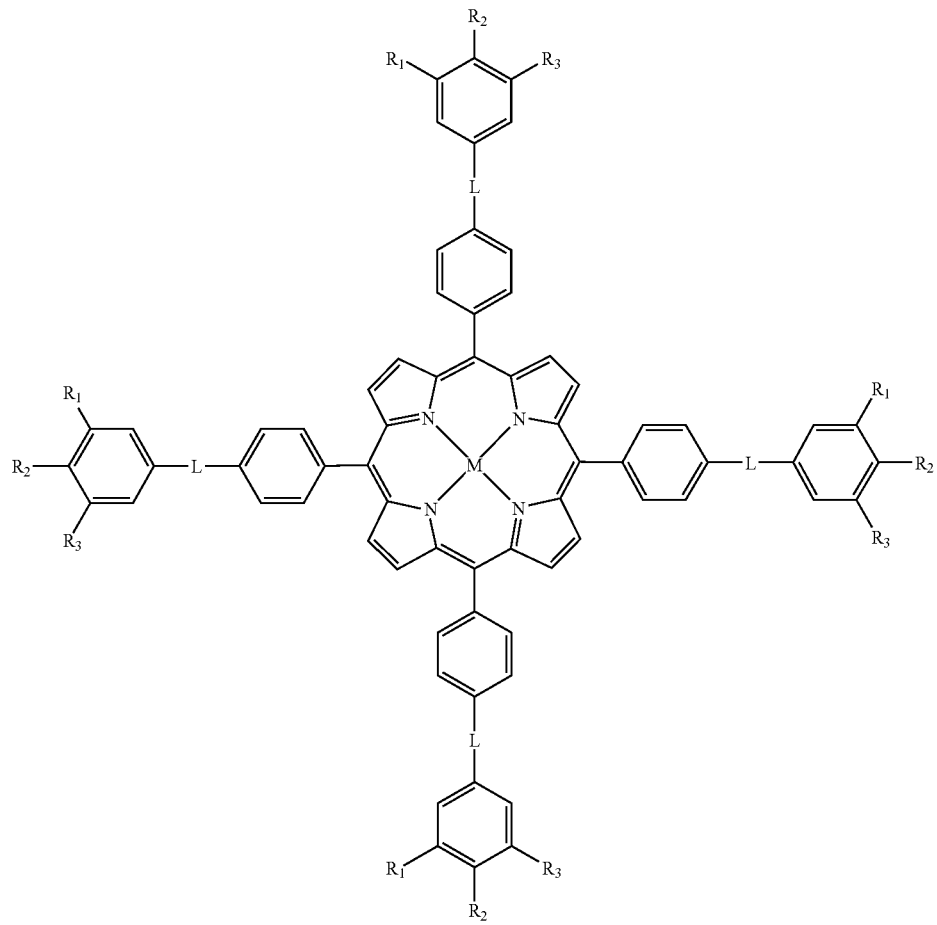

The metal atom linked to porphyrin may enhance mesophase, optical and electric properties, and affect the charge transportation process.

The present porphyrin molecules can be aligned into an ordered architecture, in which the columns formed by intermolecular π-π stacks are spontaneously perpendicular or parallel on the surface, i.e. homeotropic alignment or homogenous alignment. The ordered aligned architecture, which is stable, can excellently enhance the charge carrier mobility, and thus can dramatically improve the light induced electric generation.

The intermolecular interaction between discotic mesogens might mainly come from 1) π conjugated, core-core attraction, and 2) hydrophobic interaction between the flexible chains.

As described above, the materials with partially perfluorinated alkyl groups in the peripheral chains show a strong tendency towards the formation of homeoptropic alignment. This is thought to be due to the fact that the fluorine atom is unique in that its size is only little larger than hydrogen, while it has the highest electronegativity among all atoms. This unique combination of steric and polarity effects enables some significant tuning of physical properties without much disruption to the liquid crystal phase stability.

Generally the efficiency of the charge-generation process is extremely low when a single material forms the organic layer. This is because in conjugated materials the binding energy of the lowest singlet exciton (i.e., the strength of the Coulombic attraction between the electron and hole) is significant; this makes excitons (electron and hole) rather stable species. As a result, current organic solar cells rely on either blends made from an electron-donor component and an electron-acceptor component, or double- or multi-layered heterojunction structures. Porphyrin, which is the basic structure of chlorophyll, is a superior electron donor (p-type material). A suitable electron acceptor (n-type material) for use therewith may be dye, carbon nanotube, and/or $C_{60}$ (fullerene) or a derivative thereof. For example, $C_{60}$ or its derivative is an excellent electron acceptor, so liquid crystalline porphyrin-$C_{60}$ blend with aligned architecture would make a perfect marriage. The porphyrin absorbs the light and transfers an electron from its excited state to n-type material e.g. $C_{60}$, $C_{60}$ derivative or carbon nanotube.

With regard to photovoltaic cells, in general, crystalline molecular organic materials exhibit better transport properties than their polymeric counterparts. However, large single crystals are difficult and costly to process, while polycrystalline materials suffer from the grain boundaries and defects. This disadvantage can be overcome by utilizing the discotic liquid crystals capable of being spontaneously homeotropically aligned, because their aligned structure resembles the aromatic stacking in single crystal domains.

Discotic liquid crystals have recently been used as hole-transporting layer to construct an organic photovoltaic cell; however, their alignment is a crucial point for the resulting high conductivity and possible applications. We have achieved two important alignments on our synthesized liquid crystalline porphyrins disclosed here, namely homogeneous and homeotropic alignments. Homeotropically aligned architecture can provide a most efficient path for electrons and holes along the columnar axis which is most favorable for high conductivity and its applications in photovoltaic cells and organic light emitting diodes etc. Homogenously aligned architecture has potential applications such as organic thin-film transistors.

Figure 3:
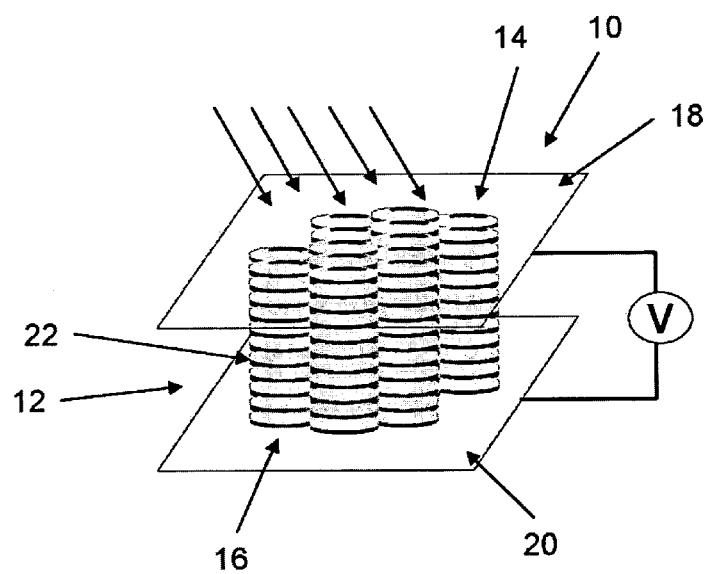
FIG. 3 is general schematic of a presently conceived photovoltaic cell.
Figure 3:
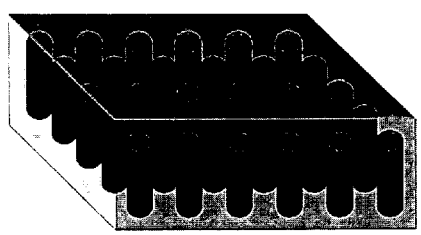
Figure 3:
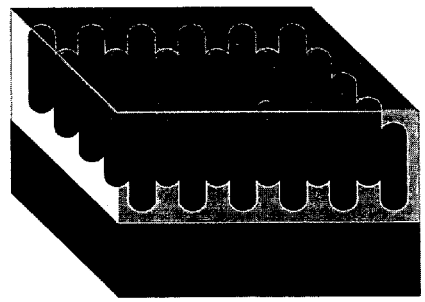
Figure 4:
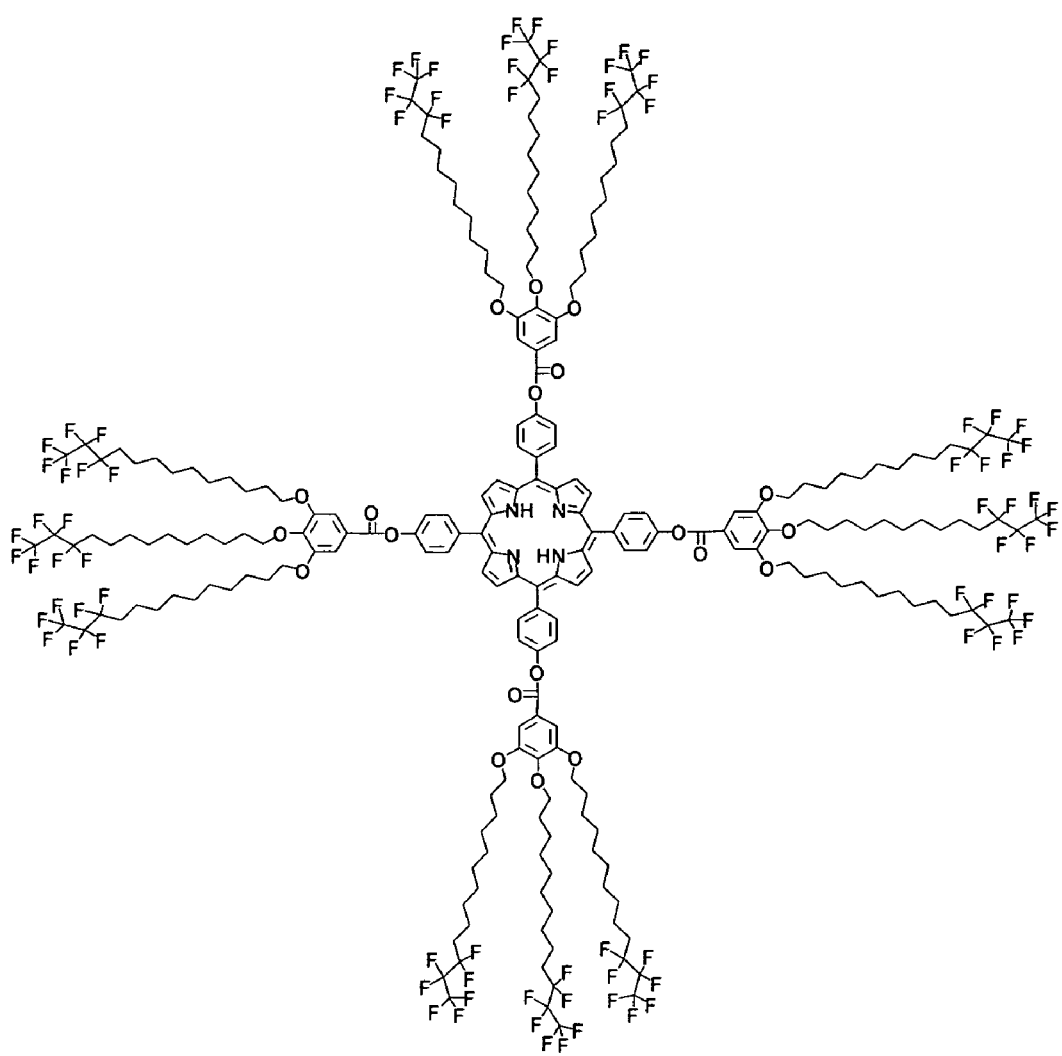
FIGS. 4-9 are molecular structures of specific exemplary compounds.
Figure 5:
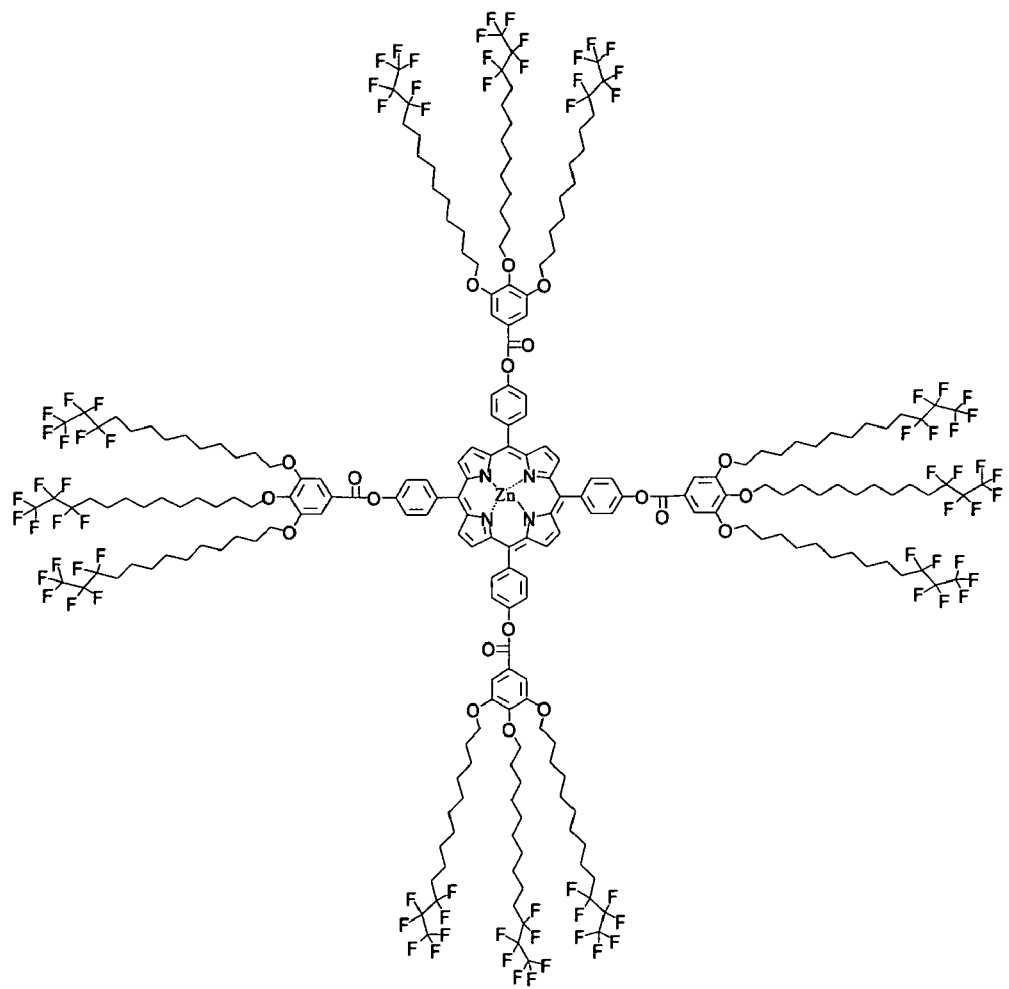
Figure 6:
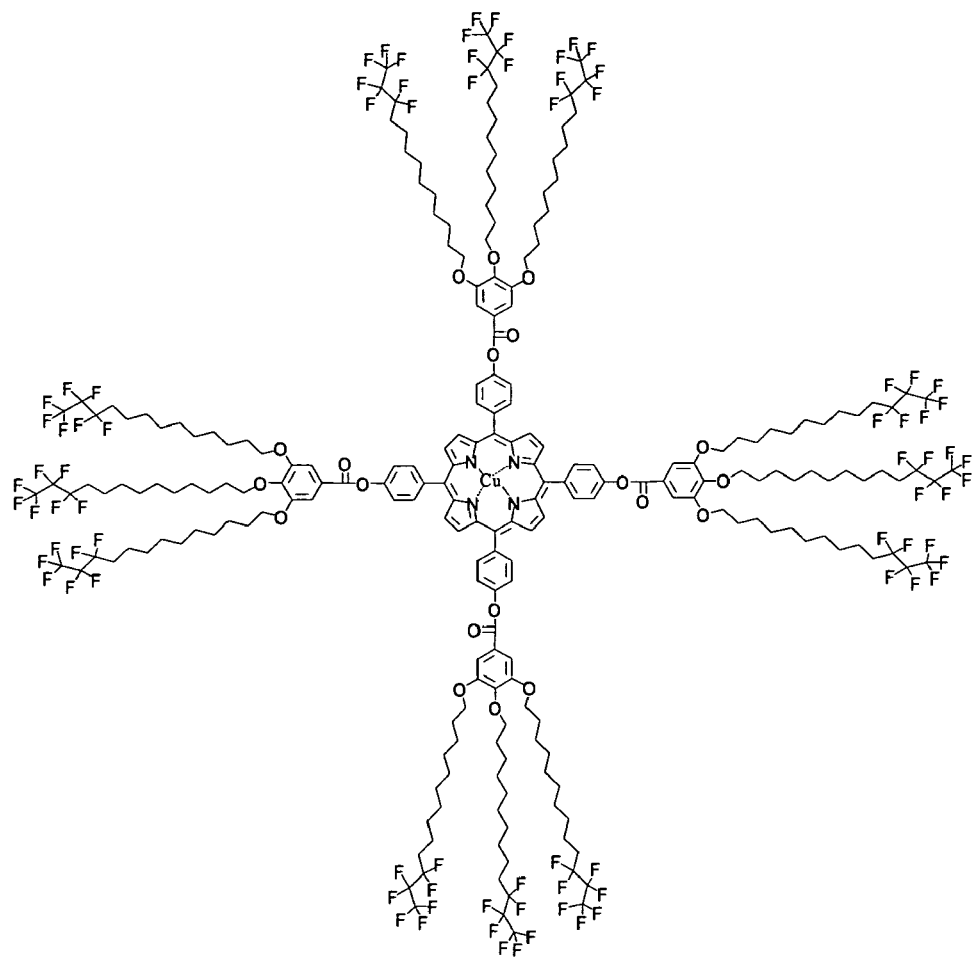
Figure 7:
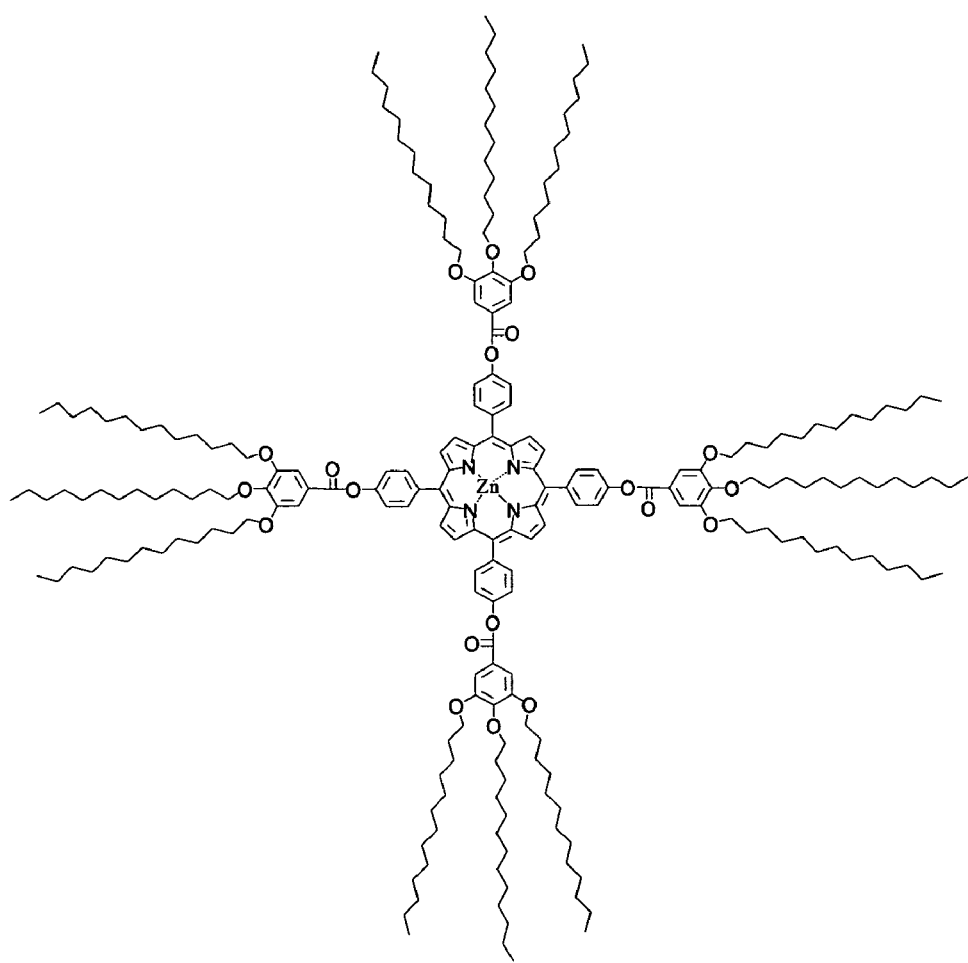
Figure 8:
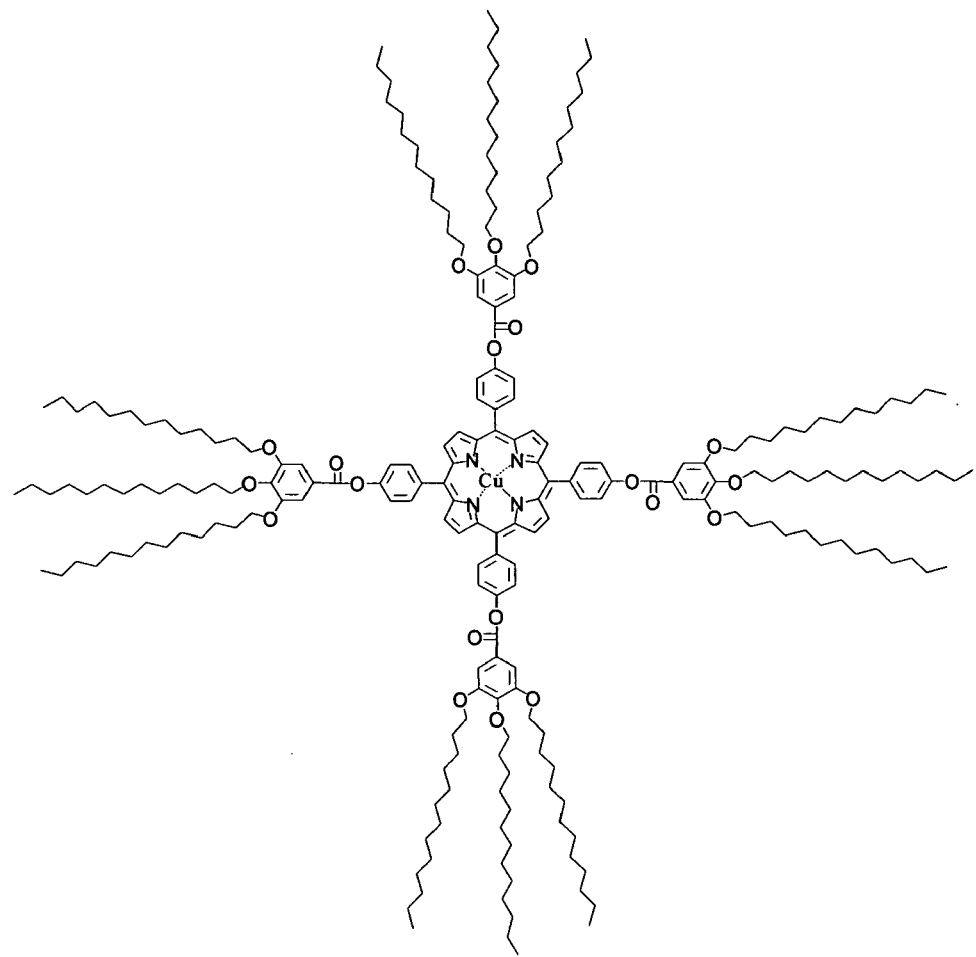

In one embodiment, the present discostic liquid crystals are used to form a photovoltaic cell. As seen in FIG. 3, the structure of a photovoltaic cell 10 includes at least one photoactive layer 12 sandwiched between first 14 and second 16 electrodes, the first of which is transparent or substantially transparent. In an embodiment, the photoactive heterojunction blend layer, or double-, or multi-layers is sandwiched between the two electrodes with different work functions. For improved cell performance, the cell is either a bulk heterojunction cell with homeotropically aligned architecture of the blend composed of a discotic liquid crystal and one or more other components which may be any material such as $C_{60}$, its derivative, a dye or a carbon nanotube, or a double-layered cell in which a donor layer is homeotropically aligned architecture of a discotic liquid crystal or homeotropically aligned architecture of its blend thereof together with an acceptor layer which may composed of any material such as $C_{60}$, its derivative, a dye or carbon nanotube. Also, for improved solar cell performance the number of layers and junctions can be multiple.

In one embodiment, the electrodes are positioned on first and second substrates 18, 20.

Thus, in one embodiment, substrates which are transparent and have insulating properties, such as a glass plate, quartz plate, plastic plate or other organic polymers, can be used as the first transparent substrate 18. The transparent electrode positioned on a surface of the transparent substrate can be composed of common electrodes such as those of indium tin oxide (ITO), tin oxide doped with Sb, F or P, indium oxide doped with Sn, Zn and/or F, antimony oxide, zinc oxide and noble metals, which may be coated with a transparent conductive polymer layer for hole collection.

The non-transparent substrate 20 may be a combined substrate/electrode and can be formed of metals such as titanium, aluminum, copper, silver, gold and nickel, and which may also be coated with an interface layer; or conducting metal oxide, such as zinc oxide, titanium oxide, etc; or conducting polymer. Alternately, a separate electrode can be positioned on a non-conducting substrate.

For example, the electrode material can be any of platinum, rhodium, metallic ruthenium and ruthenium oxide. Further, conductive materials, such as tin oxide, tin oxide doped with Sb, F or P, indium oxide doped with Sn and/or F and antimony oxide, having their surfaces overlaid with the above electrode materials by plating or vapor deposition can also be used as the electrode layer. Still further, common electrodes, such as carbon electrode, can be used for constituting the electrode layer.

As discussed above, the photoactive layer of the photovoltaic cell generally includes either one heterojunction p-n blend layer or two distinct layers forming a p-n junction.

In one embodiment, one photovoltaic cell comprises the homeotropically aligned heterojunction blend made from a discotic liquid crystal and one or more other components which may be any material such as $C_{60}$, its derivative, a dye and/or a carbon nanotube (e.g. 22a). Another photovoltaic cell comprises double layers in which homeotropically aligned discotic liquid crystal or its blend is one necessary layer, and $C_{60}$, its derivatives, dyes or carbon nanotubes as other layer (e.g. 22b). The number of layers and junctions can be more than one. In a specific embodiment, the cell is a dye sensitized device wherein the photoactive layer includes one or more dyes and a discotic liquid crystal material 22 associated with the dye.

The photosensitizing agent can be sorbed (e.g., chemisorbed and/or physisorbed) on the nanoparticles. The photosensitizing agent may be sorbed on the surfaces of the nanoparticles, within the nanoparticles, or both. The photosensitizing agent is selected, for example, based on its ability to absorb photons in a wavelength range of operation (e.g., within the visible spectrum), its ability to produce free electrons (or holes) in a conduction band of the nanoparticles, and its effectiveness in complexing with or sorbing to the nanoparticles. Suitable photosensitizing agents may include, for example, dyes that include functional groups, such as carboxyl and/or hydroxyl groups.

Examples of dyes include black dyes (e.g., tris(isothiocyanato)-ruthenium (II)-2,2':6',2"-terpyridine-4,4',4"-tricarboxylic acid, tris-tetrabutylammonium salt), orange dyes (e.g., tris(2,2'-bipyridyl-4,4'-dicarboxylato) ruthenium (II) dichloride, purple dyes (e.g., cis-bis(isothiocyanato)bis-(2, 2'-bipyridyl-4,4'-dicarboxylato)-ruthenium (II)), red dyes (e.g., an eosin), green dyes (e.g., a merocyanine) and blue dyes (e.g., a cyanine). Examples of additional dyes include anthocyanines, perylenes, porphyrins, phthalocyanines, squarates, and certain metal-containing dyes.

The discotic liquid crystal or its mixture with any electron-acceptor material such as $C_{60}$ derivative, carbon nanotube or dye is sandwiched in between these two substrates and aligned homeotropically. With further detail, the two electrodes are glued or otherwise attached and sealed to form a cell. Depending on the method of filling the cell, a small slit may be maintained for liquid crystal uptake. A typical gap thickness between the two electrodes is about 0.01-10 μm. The liquid crystal is then deposited inside the cell using known methods. After dryness of the film, the other electrode is laminated on top of the film to form a cell.

In one embodiment, the discotic liquid crystal as the hole-transporting layer and a photosensitizing agent as electron transporting layer may be prepared in a solvent and spin-coated onto an indium tin oxide electrode. Suitable solvents may be, e.g., water, alcohols, oligoethers, carbonates such as propione carbonate, phosphoric esters, dimethylformamide, dimethyl sulfoxide, N-methylpyrrolidone, N-vinylpyrrolidone, sulfur compounds such as sulfolane 66, ethylene carbonate, methylene chloride, chloroform, chlorobenzene, toluene, acetonitrile and y-butyrolactone.

Alternately, in another embodiment, the discotic liquid crystal or its blend may be heated to melting inside a vacuum chamber. The cell is then placed in the vacuum chamber to remove any air inside the cell. To fill the cell, the opening slit of the cell is dipped into the melted material. The vacuum level is then slowly reduced to allow the cell to uptake the material. Of course, other methods of filling the cell are also possible.

In specific embodiments, the photovoltaic device is composed of an ITO coated transparent electrode and an aluminum, copper, silver or gold coated reflective electrode. In specific embodiment of the invention, the transparent substrate can be glass or plastic. In specific embodiment of the invention, the alignment of the liquid crystalline porphyrin or its blend is homeotropic.

With patterned and individually addressable electrode on certain substrate, the claimed liquid crystal material could be prepared in the form of a film on top of these patterned electrode substrate in the same way as mentioned. The photosensitive resistance plus the photo-voltage produced at different site of the substrate can map the intensity of the object in front of the film. In this way, the liquid crystal material can be used as a photo-image receiver.

In one embodiment, a small area solar cell can act as a simple photosensor in conjunction with a Schmidt trigger circuit, which can set a tunable threshold voltage for detection and act as a photosensor.

EXAMPLES

In accordance with the present embodiments, a series of novel light-harvesting discotic liquid crystalline porphyrins (I) and discotic liquid crystalline porphyrin metal complexes (II) were synthesized and characterized.

Figure 9:
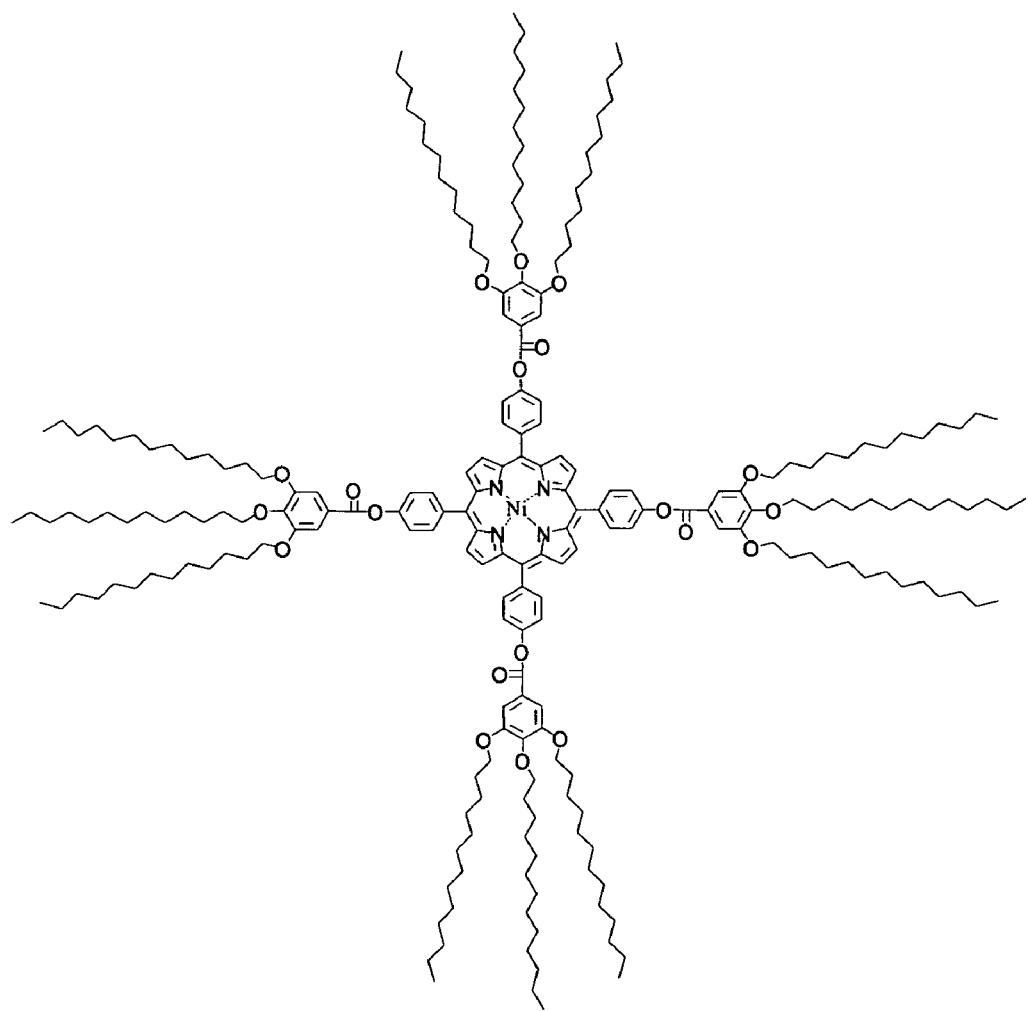
Figure 10:
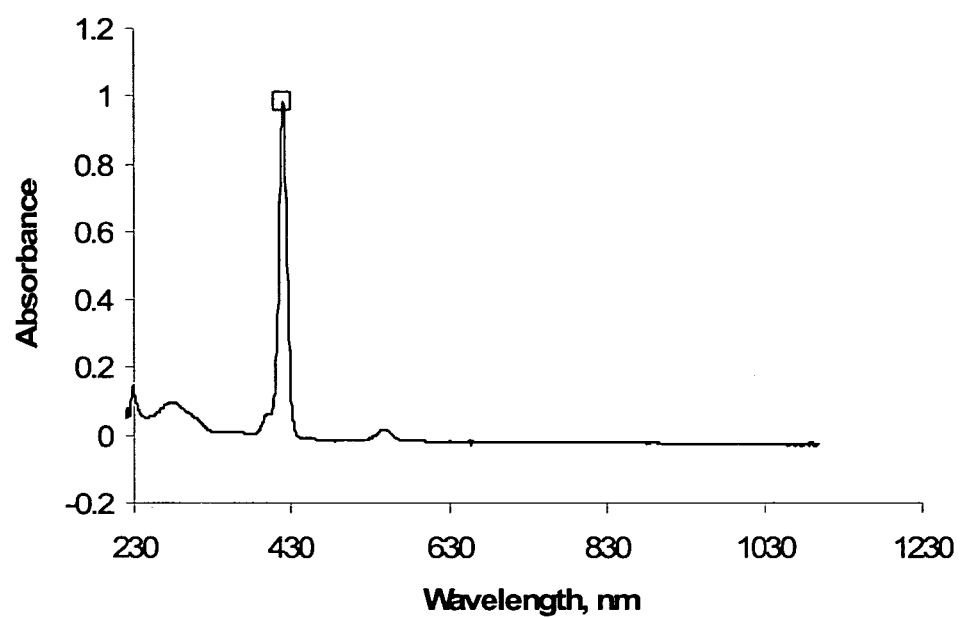
FIG. 10 is a UV-vis absorption spectrum of one of the exemplary compounds.
Figure 11:
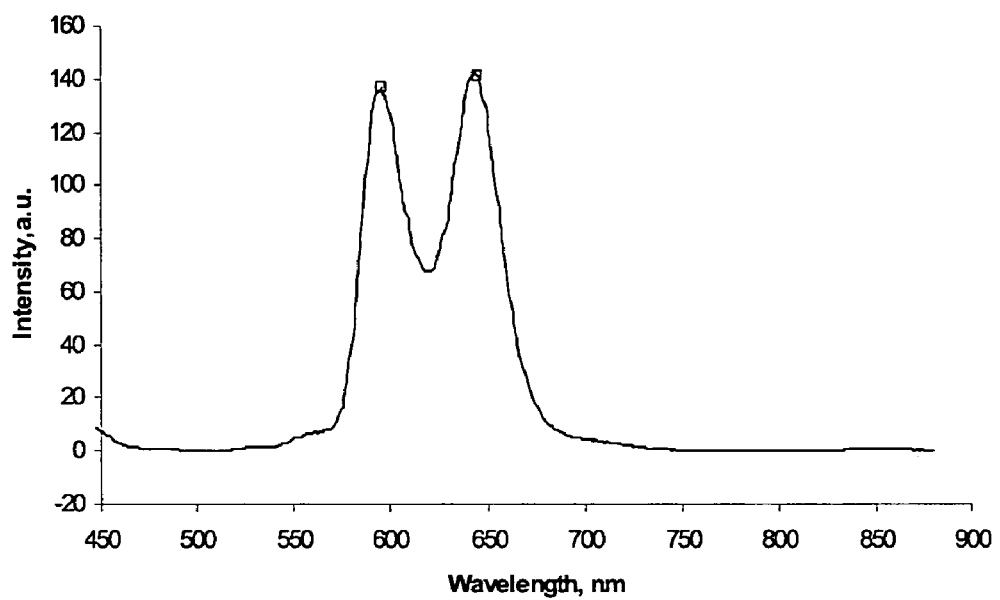
FIG. 11 is a fluorescent emission spectrum of the same exemplary compound.
Figure 12:
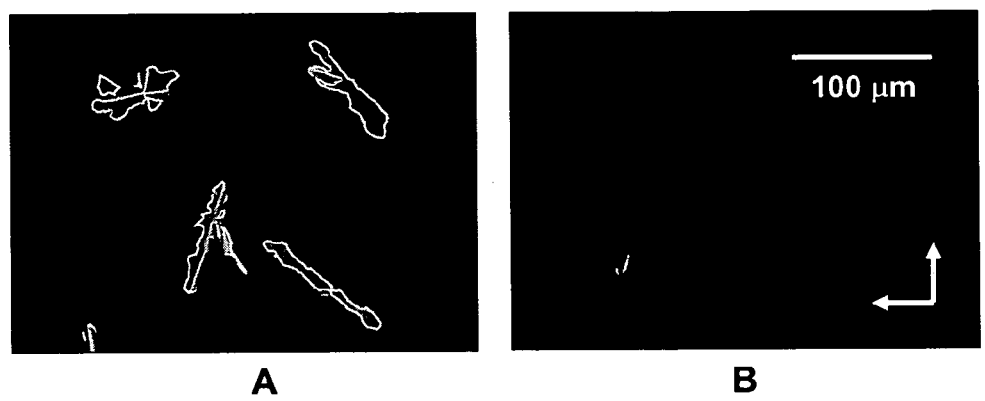
FIG. 12 is a depiction showing crossed polarized optical textures with homeotropic alignment (dark area) of one of the exemplary compounds at room temperature (A and B with different cooling rate).

The structures of the following compounds are shown in FIGS. 4-9. $C_{228}H_{274}F_{84}N_4O_{20}$ (FIG. 4), $C_{228}H_{272}F_{84}N_4O_{20}Zn$ (FIG. 5), $C_{228}H_{272}F_{84}N_4O_{20}Cu$ (FIG. 6), $C_{228}H_{356}N_4O_{20}Zn$ (FIG. 7), $C_{228}H_{356}N_4O_{20}Cu$ (FIG. 8), and $C_{228}H_{356}N_4O_{20}Ni$ (FIG. 9). Their structures were identified and confirmed by $^1H$ NMR, $^{13}C$ NMR, elemental analysis and MS. The UV-vis absorption spectrum of the compound of FIG. 5 in $CH_2Cl_2$ was measured and is shown in FIG. 10. The very strong absorption at about 420 nm enables it to be a very efficient absorber for blue photons. Another absorption peak at 549 nm enables this material to function as a good absorber for a large spectrum of sunlight. The fluorescent emission of this same compound was determined and is shown in FIG. 11 under a 420 nm excitation wavelength. Peaks can be seen at 595 and 643 nm. One of the exemplary compounds can be homeotropically aligned into an ordered architecture cooling from its isotropic phase, as shown in FIG. 12. The dark areas in FIG. 12 represent homeotropic alignment. The bright domains represent defects which appear where the porphyrin plane is not parallel to the substrate. Cooling of the material from isotropic liquid at a specific rate can provide a way to achieve a defect-free single crystal thin film.

It is to be understood that the principles of the present embodiments are applicable to any type of device that uses homeotropically or homogenously aligned architecture of any a discotic liquid crystal or a blend composed of a discotic liquid crystal and one or more other components as a layer.

The exemplary embodiment has been described with reference to the preferred embodiments. Obviously, modifications and alterations will occur to others upon reading and understanding the preceding detailed description. It is intended that the exemplary embodiment be construed as including all such modifications and alterations insofar as they come within the scope of the appended claims or the equivalents thereof.

The invention claimed is:

1. A liquid crystalline porphyrin or porphyrin metal complex, having the structure I or II below:

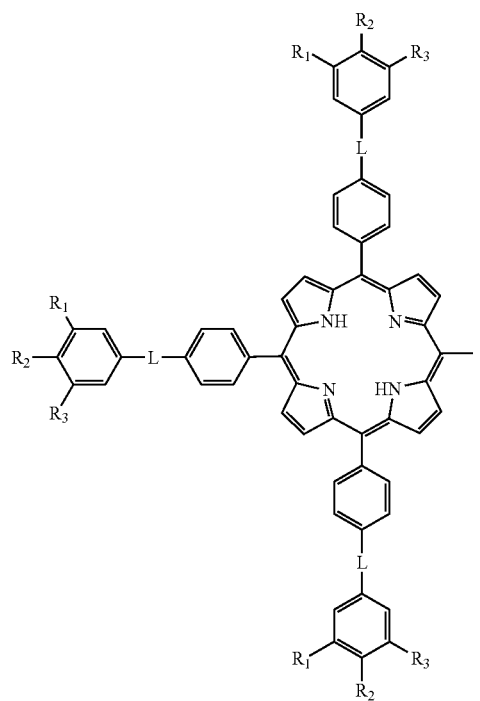

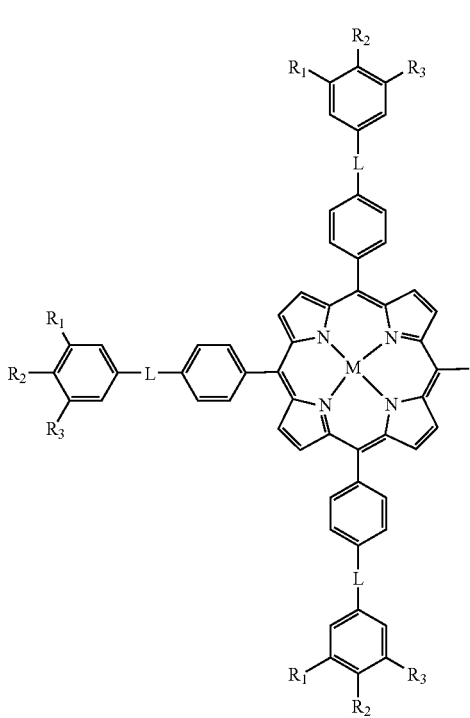

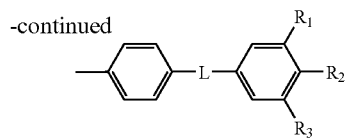

wherein L is a linking group selected from COO, OOC, O, S, COS or NHCO; M=Zn, Co, Cu, Ni, Cr, Mn, Mg, Ce, Ru, Rh, Pt, Au, or a lanthanide metal and which may be bound to a halogen, O, OH or =CO; and wherein $R_1$, $R_2$, and $R_3$ are a) $R_1=R_2=R_3$, and wherein $R_3$ is a C6-36 linear or branched alkoxy which may include at least one of the group consisting of a perfluoroalkyl group, $C_{60}$ (fullerene), a $C_{60}$ derivative, an aromatic moiety, a cyclic group, and one or more of O, S, CO, COO, N=N, C≡C, and C=C;

b) $R_1=H$, $R_2=R_3$, and wherein $R_3$ is selected from the group consisting of a C6-36 linear or branched alkoxy which may include at least one of the group consisting of a perfluoroalkyl group, $C_{60}$ (fullerene), a $C_{60}$ derivative, an aromatic moiety, a cyclic group, and one or more of O, S, CO, COO, N=N, C≡C, and C=C;

c) $R_2=H$, $R_1=R_3$, and wherein $R_3$ is selected from the group consisting of a C6-36 linear or branched alkoxy which may include at least one of the group consisting of a perfluoroalkyl group, $C_{60}$ (fullerene), a $C_{60}$ derivative, an aromatic moiety, a cyclic group, and one or more of O, S, CO, COO, N=N, C≡C, and C=C; or d) $R_1=R_3=H$, and $R_2$ is a C6-36 linear or branched alkoxy which includes at least one of the group consisting of a perfluoroalkyl group, $C_{60}$ (fullerene), a $C_{60}$ derivative, an aromatic moiety, a cyclic group, and one or more of O, S, CO, COO, N=N, C≡C, and C=C.

2. A liquid crystalline porphyrin or porphyrin metal complex according to claim 1, wherein said porphyrin can be aligned into an ordered architecture, in which the columns formed by intermolecular π-π stacks are spontaneously perpendicular or parallel on the surface.

3. A liquid crystalline porphyrin or porphyrin metal complex according to claim 2, wherein said ordered architecture is stable within a very wide temperature range and can enhance the charge carrier mobility.

4. A blend comprising the liquid crystalline porphyrin or porphyrin metal complex according to claim 1, further comprising an electron-acceptor material.

5. A blend according to claim 4, wherein said electron-acceptor material comprises a $C_{60}$ compound, a $C_{60}$ derivative compound, a dye, and/or a carbon nanotube.

6. A liquid crystalline porphyrin or porphyrin metal complex according to claim 1, wherein said porphyrin or porphyrin metal complex comprises one of the following I, II, or III:

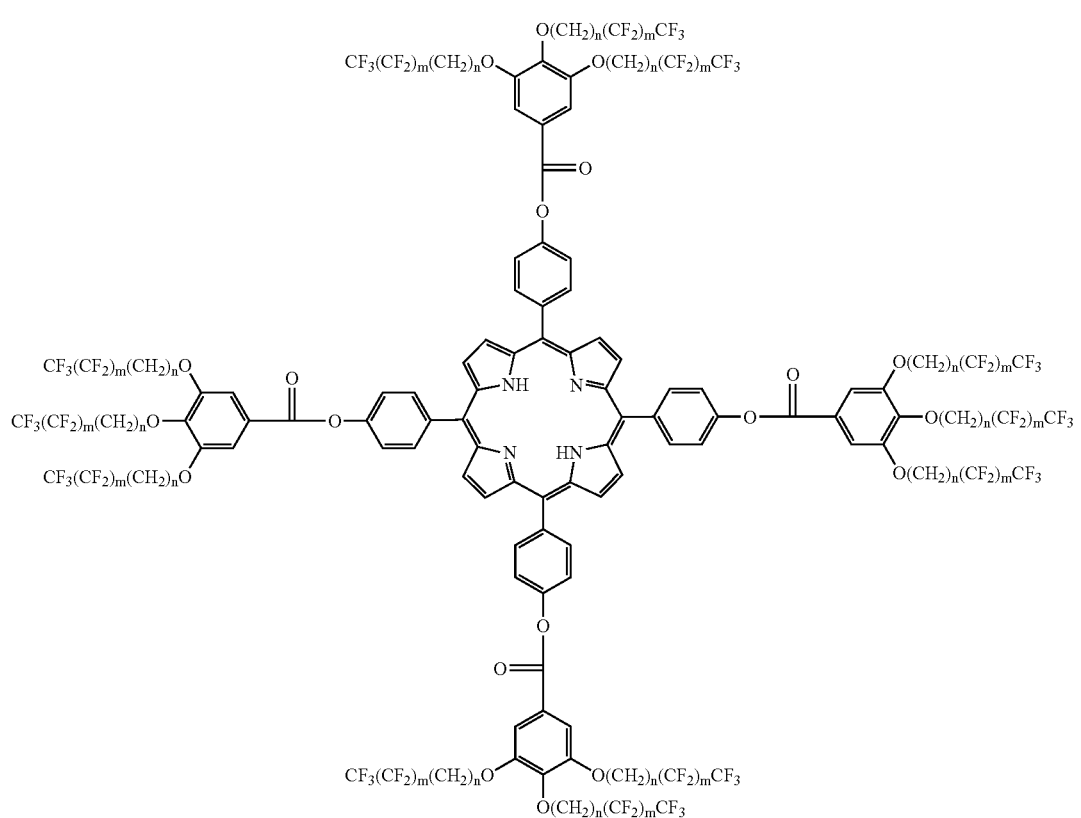
(I)
wherein m is from 0-20 and n is from 0 to 20;
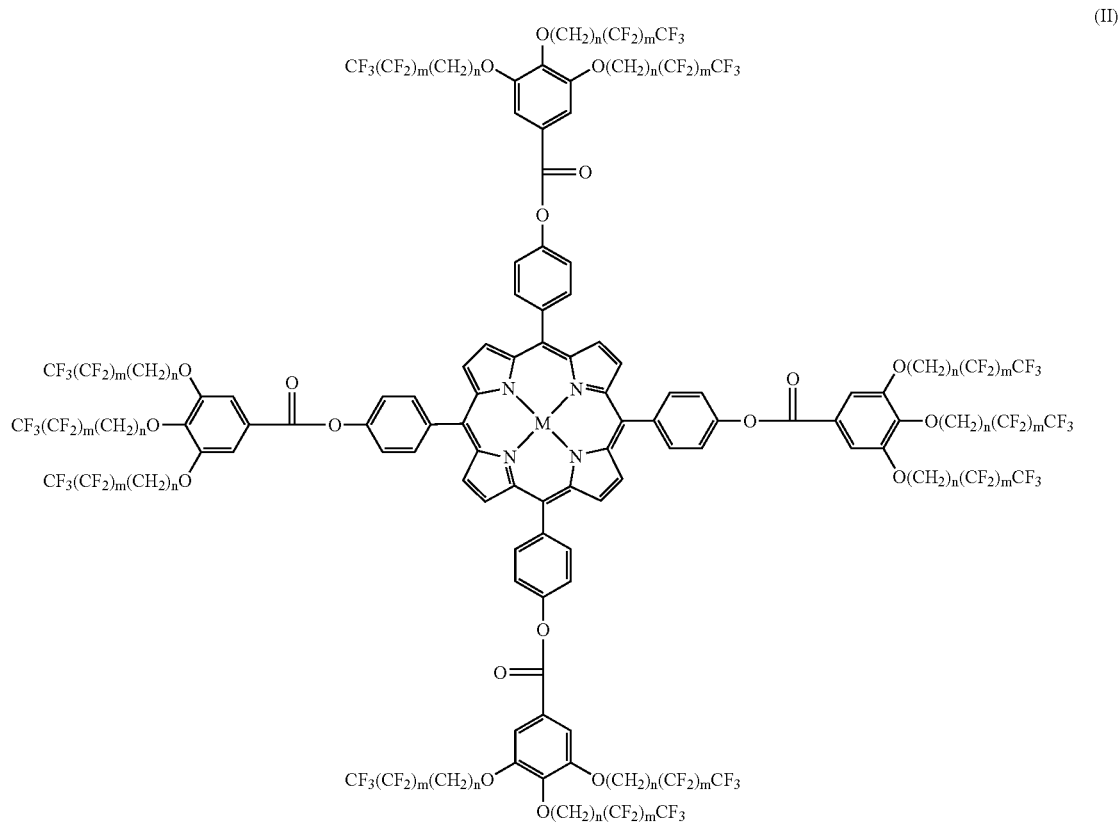
(II)

wherein m is from 0-20 and n is from 0 to 20 and wherein M=Zn, Co, Cu, Ni, Cr, Mn, Mg, Ce, Ru, Rh, Pt, Au, or a lanthanide metal and which may be bound to a halogen, O, OH or =CO;

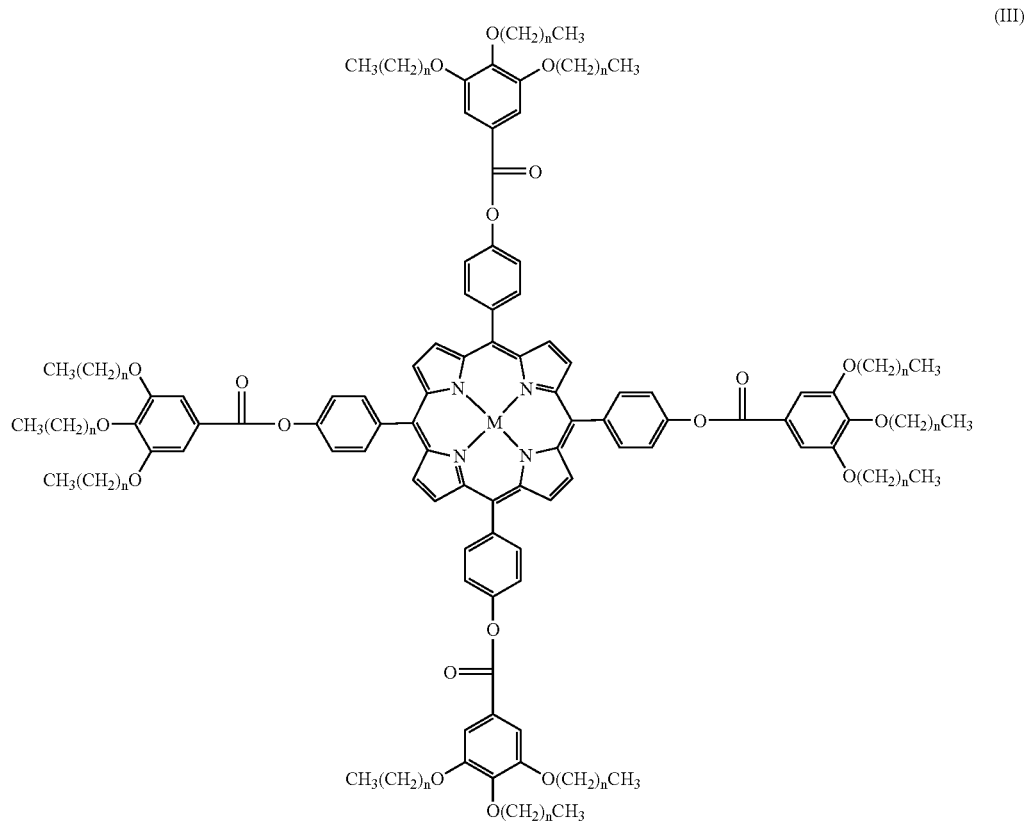

(III)

wherein n is from 5 to 35 and wherein M=Zn, Co, Cu, Ni, Cr, Mn, Mg, Ce, Ru, Rh, Pt, Au, or a lanthanide metal and which may be bound to a halogen, O, OH or =CO.

7. A method for producing the porphyrin of claim 1, comprising the following synthesis steps:

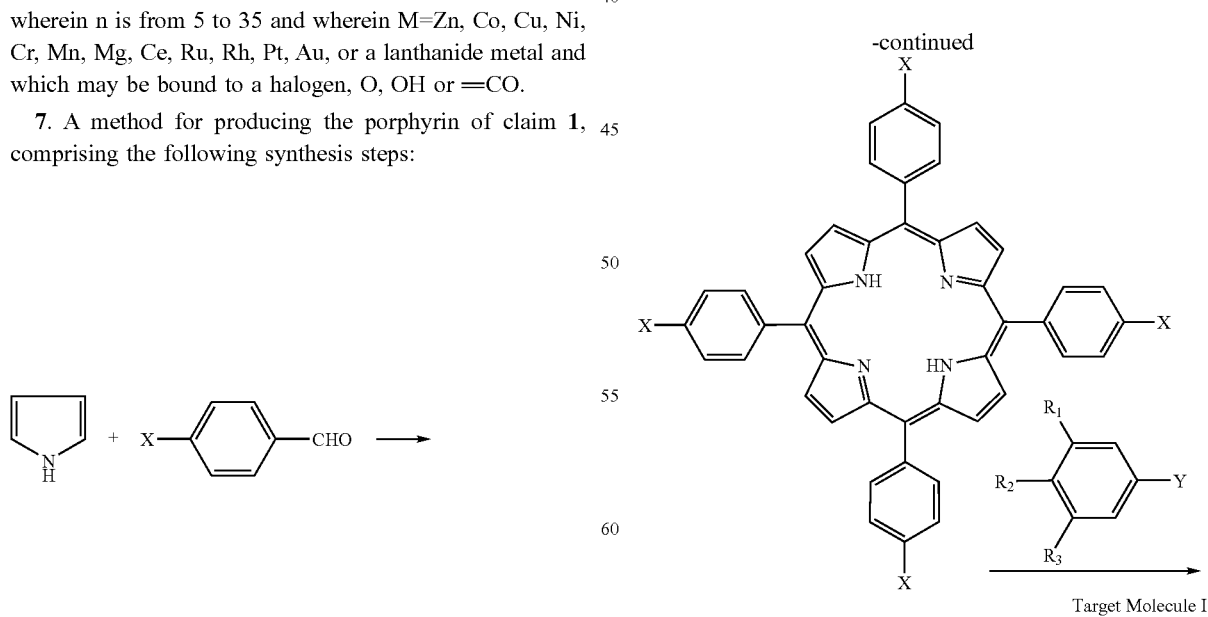

where X and Y are reactive groups suitable to allow reaction and formation of said target molecule.

8. A method according to claim 7, wherein said synthesis is conducted in an organic solvent.

9. A method according to claim 8, wherein said organic solvent comprises at least one of propionic acid, propionic anhydride, pyrrole, methylene chloride, chloroform, N,N-dimethylformamide, N-methylpyrrolidone, pyridine, triethylamine, ether, tetrahydrofuran, alcohol, ethyl acetate, acetonitrile, ethyl methyl ketone, saturated aliphatic hydrocarbons and aromatic hydrocarbons.

10. A method for producing the porphyrin of claim 1, comprising the following synthesis steps:

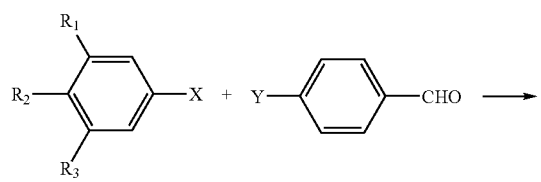

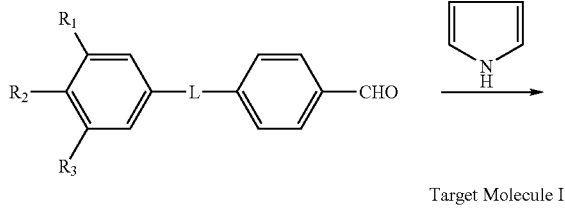

Target Molecule I where X and Y are reactive groups suitable to allow reaction and formation of said target molecule.

11. A method according to claim 10, wherein said synthesis is conducted in an organic solvent.

12. A method according to claim 11, wherein said organic solvent comprises at least one of methylene chloride, chloroform, ether, tetrahydrofuran, pyrrole, propionic acid, propionic anhydride, pyridine, triethylamine, N,N-dimethylformamide, N-methylpyrrolidone, alcohol, ethyl acetate, acetonitrile, ethyl methyl ketone, saturated aliphatic hydrocarbons and aromatic hydrocarbons.

13. A method for producing the porphyrin metal complex of claim 1, comprising the following synthesis steps:

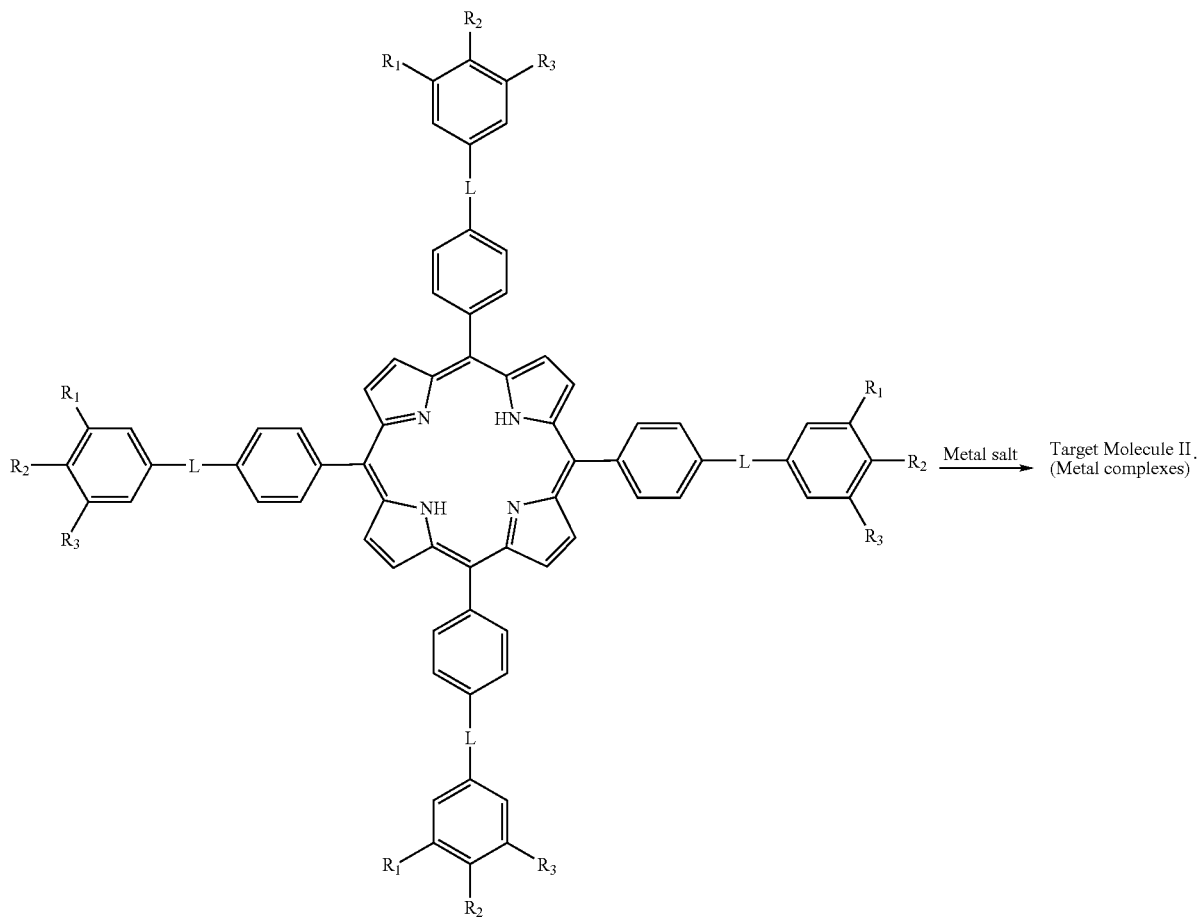

14. A photovoltaic cell including the liquid crystalline porphyrin or porphyrin metal complex of claim 1.

15. A photovoltaic cell according to claim 14, wherein said cell comprises a first transparent electrode, a second electrode, and a photoactive layer positioned between said first and second electrodes comprising the liquid crystalline porphyrin or porphyrin metal complex.

16. A photovoltaic cell according to claim 15, wherein said first electrode is an indium tin oxide electrode, wherein said electrode is coated on a glass or plastic substrate.

17. A photovoltaic cell according to claim 16, wherein said second electrode comprises aluminum, copper, silver and/or gold.

18. A photovoltaic cell according to claim 15, further comprising a photosensitizing agent.

19. A photovoltaic cell according to claim 14, further comprising an electron-acceptor.

20. A photovoltaic cell according to claim 19, wherein said electron-acceptor comprises $C_{60}$ (fullerene), a $C_{60}$ derivative, a carbon nanotube or a photosensitive dye.

21. A photo-sensitive electric resistor comprising the liquid crystalline porphyrin or porphyrin metal complex of claim 1.

22. An organic light emitting device comprising the liquid crystalline porphyrin or porphyrin metal complex of claim 1.

23. A method for producing a photovoltaic cell, including the steps of:
   a) providing a first transparent electrode and a second electrode;
   b) positioning the liquid crystalline porphyrin or porphyrin metal complex of claim 1 between said first and second electrodes; and
   c) aligning said porphyrin homeotropically.

24. A method according to claim 23, further comprising:
   d) sealing the two electrodes together while maintaining a liquid crystal uptake opening between the two;
   e) heating said porphyrin in a vacuum chamber to melt it;
   f) placing the cell in said vacuum chamber to remove air from the cell;
   g) dipping the cell opening into the melted porphyrin; and
   h) reducing the vacuum level in said vacuum chamber to allow the cell to uptake the melted porphyrin.

25. A bulk heterojunction cell having homeotropically aligned architecture comprising a blend of the liquid crystalline porphyrin or porphyrin metal complex of claim 1 and an electron-acceptor comprising $C_{60}$, a $C_{60}$ derivative, a dye and/or a carbon nanotube.

26. A double- or multi-layered photovoltaic cell comprising:
   i) a donor layer comprising a homeotropically aligned liquid crystalline porphyrin or porphyrin metal complex of claim 1 or a homeotropically aligned blend comprising said liquid crystalline porphyrin or porphyrin metal complex of claim 1; and
   ii) an acceptor layer comprising a $C_{60}$ compound, a $C_{60}$ derivative compound, a dye, and/or a carbon nanotube.

* * * * *